United States Patent
Okada

Patent Number: 5,789,924
Date of Patent: Aug. 4, 1998

[54] METHOD OF CALCULATING RECHARGEABLE BATTERY CHARGE CAPACITY

[75] Inventor: Tetsuya Okada, Sumoto, Japan

[73] Assignee: Sanyo Electric Co., Ltd., Osaka, Japan

[21] Appl. No.: 822,235

[22] Filed: Mar. 20, 1997

[51] Int. Cl.$^6$ .................. G01N 27/416; G01R 31/36
[52] U.S. Cl. .................. 324/428; 324/429; 324/430; 320/48
[58] Field of Search .................. 324/426, 427, 324/428, 429, 430; 320/48

[56] References Cited

U.S. PATENT DOCUMENTS

| | | |
|---|---|---|
| 5,404,106 | 4/1995 | Matsuda .................. 324/431 |
| 5,672,951 | 9/1997 | Shiota .................. 320/48 |

FOREIGN PATENT DOCUMENTS 3253232  11/1991  Japan

*Primary Examiner*—Glenn W. Brown
*Attorney, Agent, or Firm*—Wenderoth, Lind & Ponack, L.L.P.

[57] ABSTRACT

The method of calculating rechargeable battery charge capacity of this invention has steps to temporarily interrupt charging and calculate battery internal impedance, to calculate a no-load battery voltage by subtracting the product of internal impedance and charging current from the battery voltage when charging current is supplied, to calculate charging power by multiplying no-load voltage and charging current, and to repeatedly perform the charging power calculation integrating that charging power result to compute battery charge capacity.

8 Claims, 3 Drawing Sheets

METHOD OF CALCULATING RECHARGEABLE BATTERY CHARGE CAPACITY

BACKGROUND OF THE INVENTION

This invention relates to a method of calculating the charge capacity of a rechargeable battery.

It is extremely convenient to calculate rechargeable battery charge capacity and display the state of charge during battery charging. When this is done, not only can the time to full charge be estimated, but also usable battery capacity after completion of re-charge is known.

Methods of calculating battery charge capacity are widely known. Examples of these are the method of measuring rechargeable battery voltage during charging described in Japanese Non-examined Patent Publication No. 3-253232 issued Nov. 12, 1991, and the method of integrating charging current.

However, it is difficult to accurately measure charge capacity by the battery voltage measurement method because battery voltage varies under the influence of ambient temperature. Further, it cannot be said that the method of integrating charging current is an adequate method of calculating battery charge capacity either.

In the method of computing battery charge capacity by integrating charging current, an accurate battery charge capacity cannot be calculated if battery voltage varies. This is because an accurate battery charge capacity depends on the product of battery voltage and charging current. Battery characteristics are such that battery voltage rises as charging progresses and battery voltage decreases as discharge occurs. Further, even if voltage variation is accounted for by computing the product of charging voltage and charging current, an accurate battery charge capacity cannot be calculated. This is because charging voltage is not an accurate representation of battery voltage.

The present invention was developed for the purpose of accurately calculating battery charge capacity. It is thus a primary object of the present invent ion to provide a method of calculating rechargeable battery charge capacity which can accurately calculate battery charge capacity during charging even when battery voltage varies.

The above and further objects and features of the invention will more fully be apparent from the following detailed description with accompanying drawings.

SUMMARY OF THE INVENTION

The method of calculating rechargeable battery charge capacity of the present invention temporarily interrupts battery charging and computes the internal impedance of the rechargeable battery. The no-load voltage of the battery being charged is calculated from the internal impedance. The no-load voltage is calculated by subtracting the product of charging current and internal impedance, that is the voltage drop due to internal impedance, from the battery voltage during charging. This no-load voltage is multiplied by the charging current to compute charging power.

Subsequently, charging power is repeatedly calculated, and the calculated charging power is integrated to compute rechargeable battery charge capacity. In this manner, the method of the present invention for calculating rechargeable battery charge capacity can accurately compute the rechargeable battery's charge capacity.

DETAILED DESCRIPTION OF THE INVENTION

Figure 1:
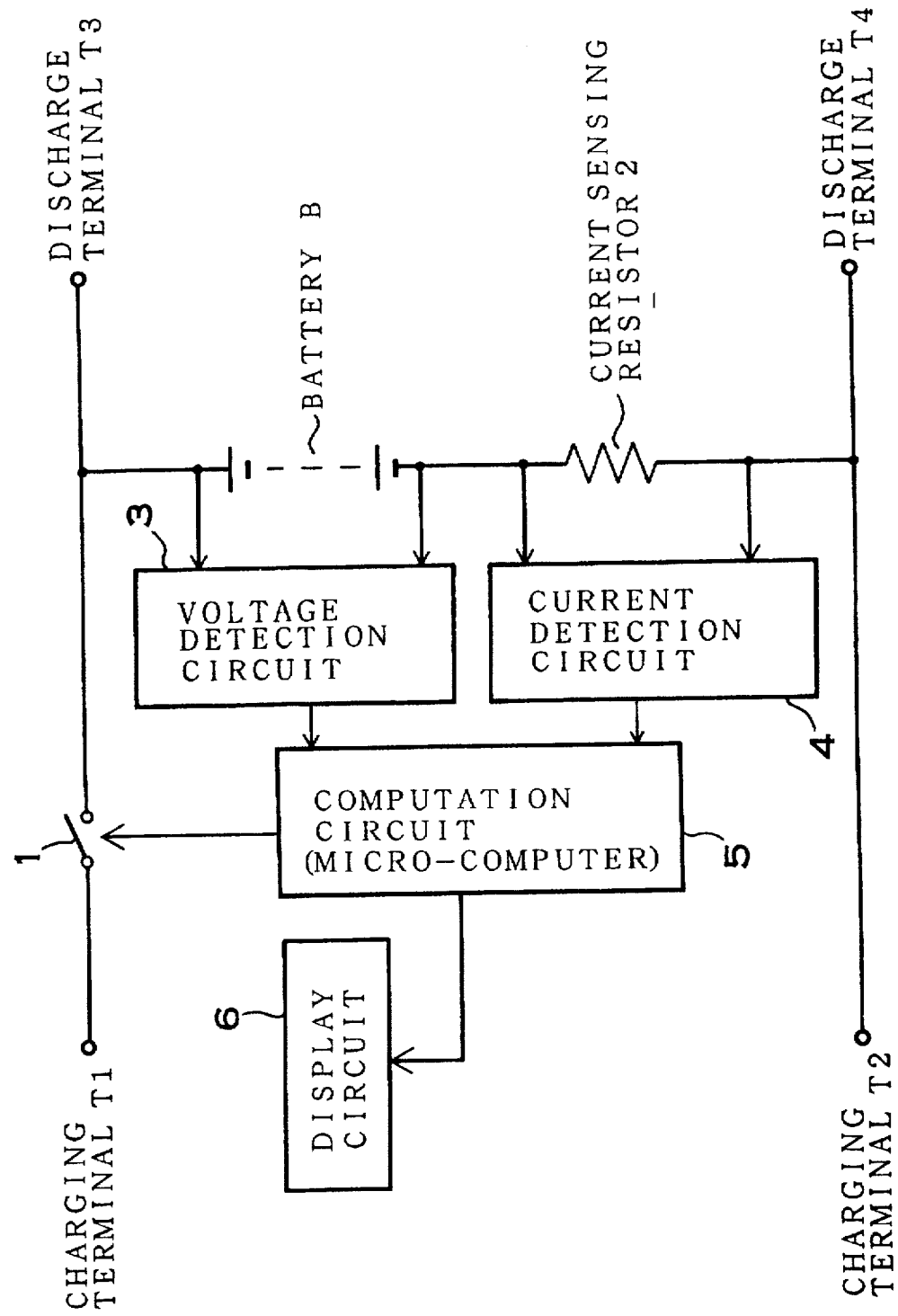
FIG. 1 is a block circuit diagram for implementation of the present invention.

Turning to FIG. 1, a block circuit diagram for implementing the method of the present invention is shown. FIG. 1 shows a battery pack containing rechargeable batteries B comprising lithium ion rechargeable batteries. The battery pack is provided with a pair of charging terminals T1 and T2, and a pair of discharge terminals T3 and T4. Although not illustrated, a battery charging apparatus connects between the charging terminals T1 and T2. The battery charging apparatus supplies charging voltage and current for charging the batteries B.

A charging control switch 1 is connected between charging terminal T1 in the battery pack and the positive electrode side of the rechargeable batteries B. This charging control switch 1 is made up of a transistor, a metal-oxide-semiconductor field effect transistor (MOSFET), or a relay switch. On the other side of the battery pack, a current sensing resistor 2, for measuring the amount of charging current, is connected between charging terminal T2 and the negative electrode side of the rechargeable batteries B.

A voltage detection circuit 3 is provided to measure the battery voltage of the rechargeable batteries B, and a current detection circuit 4 measures the amount of charging current based on the voltage across the terminals of the current sensing resistor 2. A computation circuit 5 made up of a micro-computer calculates rechargeable battery B charge capacity based on battery voltage measured by the voltage detection circuit 3 and charging current measured by the current detection circuit 4. Further, the computation circuit 5 controls the charging control switch 1 on and off at specified time intervals.

A display circuit 6 is provided to display battery charge capacity calculated by the computation circuit 5. The display circuit 6 is made up of a plurality (for example, five) light emitting diode (LED) display elements and their associated driver circuitry. For example, one LED lights for every 20% of charging performed.

Figure 2:
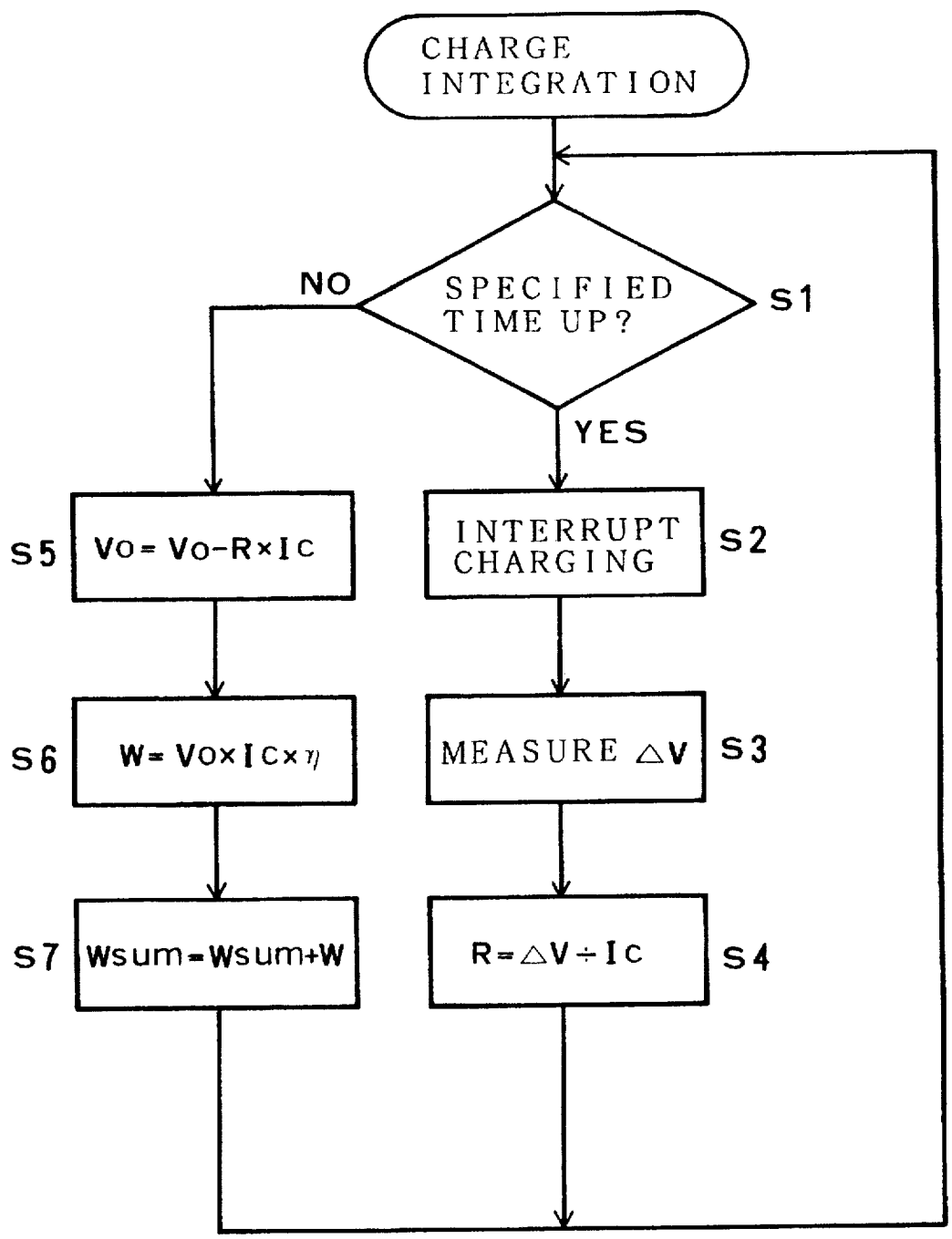
FIG. 2 is an operation flow-chart showing an embodiment of the present invention.
Figure 3:
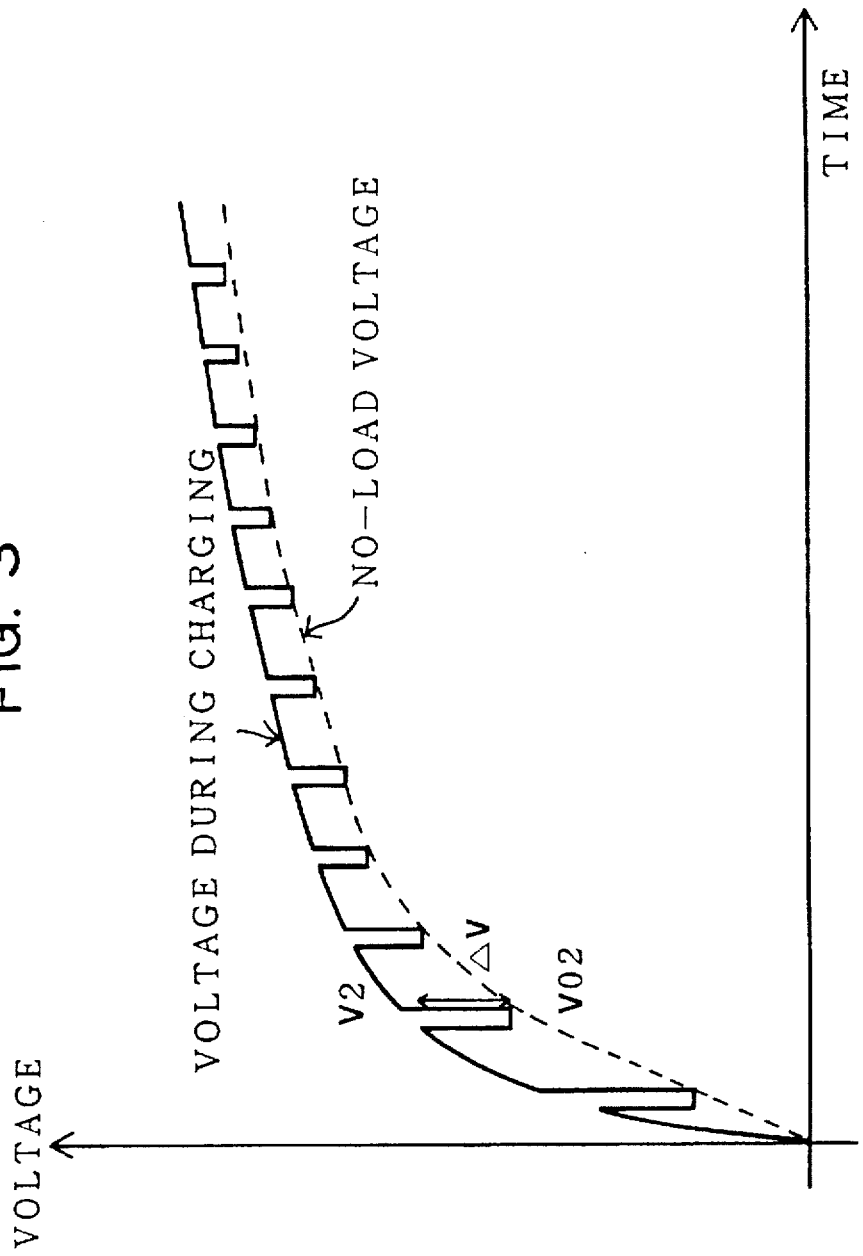
FIG. 3 is a graph showing rechargeable battery voltage variation in the present invention.

FIG. 2 is an operation flow-chart for an embodiment of the present invention, and FIG. 3 is a graph showing battery voltage variation during charging.

The battery pack is charged by connecting charging terminals T1 and T2 to a battery charging apparatus (not illustrated), by putting the charging control switch 1 in the on state, and by supplying the rechargeable batteries B with a prescribed charging voltage and charging current Ic.

In this configuration, the internal impedance of the rechargeable batteries B is calculated at specified time intervals (for example, every 5 min.) in steps S1 through S4 of the present embodiment. First, in step S1 a decision is made whether or not the specified time interval has elapsed. Next, in step S2 when the specified time is up, the charging control switch 1 is turned off to temporarily interrupt the supply of charging current Ic to the rechargeable batteries B.

In step S3, as shown for example in FIG. 3, a voltage difference $\Delta V$ (=V2−V02) is calculated. This is the difference between battery voltage V2 when charging current Ic is supplied to the rechargeable batteries, and battery voltage V02 when charging current Ic is interrupted. Next, in step S4, rechargeable battery B internal impedance R (=$\Delta V \div Ic$)

is calculated by dividing the voltage difference ΔV by the charging current Ic. Flow then returns to step S1.

With rechargeable battery B internal impedance R calculated in this fashion, subsequent processing periodically computes rechargeable battery B charging power at prescribed time intervals in steps S5 through S7 until the specified time has elapsed. These computed charging power results are then integrated.

Specifically, in step S5 no-load voltage Vo (=Vc−R×Ic) is calculated (broken line in FIG. 3) by subtracting the product of internal impedance R and charging current Ic from the battery voltage Vc during the supply of charging current Ic to the rechargeable batteries B. This no-load voltage Vo calculation is performed repeatedly, for example, with a period of several tens of milliseconds to several tens of seconds until the specified time (5 min.) has elapsed.

Next, in step S6, no-load voltage Vo is multiplied by charging current Ic to compute charging power. In this embodiment, the current-voltage product is further multiplied by a charging efficiency factor η to compute charging power W (=Vo×Ic×η). The charging efficiency factor η is a suitable value selected depending on conditions such as ambient temperature and is, for example, 0.90 to 0.95.

In step S7, rechargeable battery charge capacity Wsum is calculated by integrating the computed charging power. Subsequently, battery charge capacity Wsum is measured by integration of charging power computed at periodic intervals due to repetition of steps S5 through S7.

Finally, when the specified time has elapsed, rechargeable battery internal impedance is again calculated by re-execution of steps S2 through S4. In subsequent charging power computations, the previously calculated internal impedance is now replaced with the latest internal impedance value.

The battery charge capacity Wsum, measured in manner described above, is displayed by the display circuit 6.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. A method of calculating rechargeable battery charge capacity comprising steps:

(1) interrupting rechargeable battery charging to calculate rechargeable battery internal impedance;

(2) calculating a no-load voltage by subtracting the product of internal impedance and charging current from the battery voltage when the rechargeable batteries are supplied with charging current;

(3) calculating charging power by multiplying the no-load voltage and the charging current; and (4) repeatedly calculating charging power, and integrating the calculated charging power to compute rechargeable battery charge capacity.

2. A method of calculating rechargeable battery charge capacity as defined in claim 1 where in lithium ion rechargeable batteries are taken as the rechargeable batteries.

3. A method of calculating rechargeable battery charge capacity as defined in claim 1 wherein the steps to calculate internal impedance are performed at first periodic intervals.

4. A method of calculating rechargeable battery charge capacity as defined in claim 3 wherein the charging power calculation is repeatedly performed at second periodic intervals shorter than first periodic intervals for internal impedance calculation, and battery charge capacity is computed by integrating the charging power.

5. A method of calculating rechargeable battery charge capacity as defined in claim 4 wherein the charging power calculation is repeatedly performed with a period of several tens of milliseconds to several tens of seconds.

6. A method of calculating rechargeable battery charge capacity as defined in claim 1 wherein the steps to calculate internal impedance are made up of steps:

(1) calculating a voltage difference between battery voltage when the rechargeable batteries are supplied with charging current, and battery voltage when the supply of charging current is interrupted; and (2) dividing this voltage difference by the charging current.

7. A method of calculating rechargeable battery charge capacity as defined in claim 1 wherein the steps to calculate charging power are characterized in that a step to multiply the calculated charging power by a rechargeable battery charging efficiency factor is provided.

8. A method of calculating rechargeable battery charge capacity as defined in claim 7 wherein the charging efficiency factor is 0.90 to 0.95.

* * * * *